United States Patent [19]

Nguyen-Dinh

[11] Patent Number: 4,935,072
[45] Date of Patent: Jun. 19, 1990

[54] PHASE STABLE SINGLE CRYSTAL MATERIALS

[75] Inventor: Xuan Nguyen-Dinh, Scottsdale, Ariz.

[73] Assignee: Allied-Signal, Inc., Phoenix, Ariz.

[21] Appl. No.: 177,793

[22] Filed: Apr. 7, 1988

Related U.S. Application Data

[63] Continuation of Ser. No. 862,865, May 13, 1986, abandoned.

[51] Int. Cl.$^5$ .............................................. C21D 1/00
[52] U.S. Cl. .................... 148/162; 148/404; 148/410; 420/445; 420/448
[58] Field of Search ............... 420/445, 448; 148/404, 148/410, 162

[56] References Cited

U.S. PATENT DOCUMENTS

| | | | |
|---|---|---|---|
| 3,171,739 | 3/1965 | Cape | 75/134 |
| 3,494,709 | 2/1970 | Piearcey | 416/232 |
| 3,837,933 | 9/1974 | Masumoto et al. | 148/31.55 |
| 3,887,363 | 6/1975 | Smashey et al. | 75/171 |
| 3,893,851 | 7/1975 | Culling | 75/171 |
| 3,916,497 | 11/1975 | Doi | 420/448 |
| 3,922,168 | 11/1975 | Restall et al. | 75/171 |
| 3,988,118 | 10/1976 | Grierson et al. | 29/182 |
| 4,012,241 | 3/1977 | Lemkey | 148/32 |
| 4,019,899 | 4/1977 | Negishi et al. | 75/134 F |
| 4,116,723 | 9/1978 | Gell et al. | 148/410 |
| 4,153,455 | 5/1979 | Eiselstein et al. | 75/171 |
| 4,169,726 | 10/1979 | Fairbanks | 75/134 |
| 4,169,742 | 10/1979 | Wukusick . | |
| 4,205,985 | 6/1980 | Yamazaki et al. | 75/171 |
| 4,209,348 | 6/1980 | Duhl et al. | 148/3 |
| 4,222,794 | 9/1980 | Schweizer et al. | 148/3 |
| 4,248,629 | 2/1981 | Pons et al. | 75/122 |
| 4,292,076 | 9/1981 | Gigliotti et al. | 420/448 |
| 4,388,124 | 6/1983 | Henry | 148/404 |
| 4,765,850 | 8/1988 | Schweizer | 148/404 |

FOREIGN PATENT DOCUMENTS

| | | | |
|---|---|---|---|
| 143694 | 6/1985 | European Pat. Off. | 420/448 |
| 0150917 | 8/1985 | European Pat. Off. . | |
| 0225837 | 6/1987 | European Pat. Off. . | |
| 60-50136 | 3/1985 | Japan | 420/448 |
| 974185 | 11/1964 | United Kingdom | 429/448 |
| 1557900 | 12/1979 | United Kingdom . | |
| 1562082 | 3/1980 | United Kingdom . | |

Primary Examiner—Stephen J. Lechert, Jr.
Attorney, Agent, or Firm—R. Steven Linne; James W. McFarland

[57] ABSTRACT

Nickel base superalloy single crystal articles, preferably aircraft gas turbine blades and vanes, and a process for preparation thereof, wherein phase stability after extended elevated temperature exposure is enhanced by controlling the content of heavy refractory elements and gamma prime phase forming elements. The nominal alloy composition range in weight percent is 4-6 percent chromium, 8-12 percent cobalt, 1-2.5 percent molybdenum, 3-6 percent tungsten, 1.8-3.2 percent rhenium, 0-2.5 percent ruthenium, 5-6 percent aluminum, 0.5-1.5 percent titanium, 7-10 percent tantalum, 0.08-0.12 percent hafnium, balance nickel. The sum of the heavy refractory elements molybdenum plus tungsten plus rhenium is 8.4-10.4 percent, and the sum of the gamma prime forming elements aluminum plus titanium plus tantalum is 13.8-15.7 percent.

24 Claims, 1 Drawing Sheet

PHASE STABLE SINGLE CRYSTAL MATERIALS

This application is a Continuation of application Ser. No. 862,865 filed May 13, 1986 abandoned.

BACKGROUND OF THE INVENTION

This invention relates to nickel-based superalloys and, more particularly, to a single crystal superalloy which is resistant to the formation of undesirable phases during extended elevated temperature exposure.

The performance of jet engines and turbo prop engines is limited by the high temperature performance of the gas turbine blades and vanes used in the engines. In such aircraft gas turbine power plants, fuel and air are mixed and burned. and the hot combustion gas is directed against the vanes, which turn the gas flow partially sideways and thence against the turbine blades. The turbine blades are mounted on a rotating disk, and the rotation of the disk generates power which can be used to draw more air into the engine and to turn a propeller, in the case of a turbo prop. The gas turbine blades and vanes must therefore operate in an extremely hostile environment, of high temperatures, high loadings, fatigue, oxidation and corrosion. Because the turbine vane and blades lie at the heart of the engine, relatively minor improvements in performance can have highly significant effects on the performance, economics and life of the engine. Much effort has been devoted to improving the performance of the materials that are used to fabricate the vanes and blades.

Turbine vanes and blades used in current aircraft engines are polycrystalline superalloys, which are nickel and cobalt based alloys having superior elevated temperature performance. The microstructure of such materials includes a multitude of small grains having various orientations. At elevated temperatures, the grains slip past each other to cause deformation by creep, and part of the improvement of these materials has been to inhibit such creep by strengthening the grain boundaries. In the last few years, it has become commercially feasible to manufacture entire vanes and blades as single crystals of superalloys, which do not have grain boundaries. It is therefore possible to eliminate the additions of elements formerly required to strengthen the grain boundaries, a modification which in turn improves the elevated temperature properties of the single-crystal metallic superalloy.

In the ongoing search to improve the properties of turbine blades and vanes, considerable attention is now focused on improving the stability of such component s at elevated temperatures. One critical type of instability stems from the formation of brittle phases, either during solidification of the alloy or during elevated temperature exposure in use. The sigma phase is one such phase, and its formation is known to embrittle the components. Embrittlement in turn reduces the life expectancy of the blade or vane.

There is therefore an ongoing need improved superalloys used to prepare single crystal articles such as turbine vanes and blades, and a process for producing such articles. The single crystal articles should have excellent strength, ductility, and fatigue and creep resistance at elevated temperatures, as well as metallurgical stability and resistance to environmental damage such as oxidation and corrosion. Manufacture of the articles should be compatible with existing manufacturing techniques, including single crystal growth, heat treatment and coating procedures. The present invention fulfills this need, and further provides related advantages.

SUMMARY OF THE INVENTION

The present invention resides in nickel-base superalloy single crystal articles which have excellent elevated temperature mechanical properties, making the articles particularly suitable for use as turbine vanes and blades. The articles also exhibit excellent metallurgical stability during elevated temperature exposure, and good oxidation and hot corrosion resistance. The articles are readily prepared by existing manufacturing techniques, including melting, single crystal growing, heat treating and coating procedures.

In accordance with the invention, a nickel-base superalloy single crystal article comprises a single crystal having a composition in weight percent consisting essentially of from about 4 to about 6 percent chromium, from about 8 to about 12 percent cobalt, from about 1 to about 2.5percent molybdenum, from about 3 to about 6 percent tungsten, from about 1.8 to about 3.2 percent rhenium, from about 0 to about 2.5 percent aluminum, from about 0.5 to about 1.5 percent titanium from about 7 to about 10 percent tantalum, from about 0.08 to about 0.12 percent hafnium, balance nickel, wherein the sum of molybdenum plus tungsten plus rhenium is from about 8.4 to about 10.4 percent and the sum of aluminum plus titanium plus tantalum is from about 13.8 to about 15.7 percent, the article being substantially free of vanadium, carbon, boron, and zirconium. The article is preferably a turbine vane or blade, and preferably has a microstructure comprising a distribution of gamma prime particles in a gamma matrix.

Narrow ranges of the alloying elements have been found to produce further optimized properties, and a preferred article comprises a single crystal having a composition in weight percent consisting essentially of from about 4.6 to about 5.6 percent chromium, from about 9.7 to about 10.3 percent cobalt, from about 1.4 to about 2.0 percent molybdenum, from about 4.8 to about 5.2 percent tungsten, from about 2.8 to about 3.2 percent rhenium, from about 5.3 to about 5.7 percent aluminum, from about 0.5 to about 1.0 percent titanium, from about 8.0 to about 9.0 percent tantalum, from about 0.08 to about 0.12 percent hafnium, balance nickel, wherein the sum of molybdenum plus tungsten plus rhenium is from about 8.4 to about 10.4 percent and the sum of aluminum plus titanium plus tantalum is from about 13.8 to about 15.7 percent, the article being substantially free of vanadium, carbon, boron and zirconium.

A most preferred article comprises a single crystal having a composition in weight percent consisting essentially of about 4.8 percent chromium, about 10.0 percent cobalt, from about 1.5 to about 2.1 percent molybdenum, about 4.8 percent tungsten, about 2.9 percent rhenium, from about 5.2 to about 5.5 percent aluminum, from about 0.5 to about 1.1 percent titanium, about 8.0 to about 9.0 percent tantalum, and about 0.10 percent hafnium, balance nickel, wherein the sum of aluminum plus titanium plus tantalum does not exceed about 15.0 percent, the article being substantially free of vanadium, carbon, boron and zirconium. Single-crystal articles of this composition have particularly good properties and stability.

In another aspect of the invention, a process for preparing a nickel-base superalloy single crystal article comprises the steps of preparing an alloy having a composition as set forth above for the present invention, or its preferred or most preferred forms, and preparing a single crystal article from the alloy. The prepared single crystal is then solution heat treated at a temperature of greater than the gamma prime solvus for the selected alloy composition, and then aged to produce a microstructure comprising a distribution of gamma prime particles in a gamma matrix. Optionally, the prepared single crystal may be coated with a protective coating.

The articles of the present invention are particularly suited for use as turbine blades and vanes, by virtue of their excellent high temperature mechanical and environmental properties, as well as their phase stability. These components may be fabricated using established methods, and then the components can be further coated with oxidation and corrosion resistant coatings Finally, the articles can be solution treated and aged to produce an optimum microstructure for mechanical properties. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENT

As is shown in the figures for the purpose of illustration, the present invention is embodied in a nickel-base superalloy single crystal article such as a turbine blade or vane used in a gas turbine engine. FIG. i illustrates a turbine blade 10 as an example of such a gas turbine component. The blade 10 includes a root section 12 for attachment to a turbine wheel (not shown) and an airfoil 14 upon which a hot gas stream impinges. The turbine blade 10 is typically coated with a thin coating of an oxidation and corrosion resistant metal or non-metal having a thickness of a few thousandths of an inch. The present invention is concerned with the underlying component or substrate, and not with the coating. Nevertheless, the substrate material, composition and structure are chosen so as to be compatible with the necessary coatings.

The article of the present invention, such as the turbine blade 10, is necessarily formed as a single crystal of metal, at least in the section comprising the airfoil 14. As used herein, a single crystal article is one in which substantially all of the article has a single crystallographic orientation through the load bearing portions, without the presence of high angle grain boundaries. Low angle grain boundaries, such as tilt or twist boundaries, are permitted within such a single crystal article, but are preferably not present. However, such low angle boundaries are often present after solidification and formation of the single crystal article, or after some deformation of the article during creep or other deformation process.

Other minor irregularities are also permitted within the scope of the term "single crystal." For example, small areas of high angle rain boundaries may be formed directly adjacent the coating during the diffusional interaction of the coating and the substrate, and during thermal cycling of the component. Small areas of high angle grain boundaries may also be formed in the root section 12, particularly adjacent the contact surfaces with turbine wheel. Such minor amounts of deviation from a perfect single crystal, which are found in normal commercial production operations and use of the articles, are within the scope of the term "single crystal" as used herein.

Figure 2:
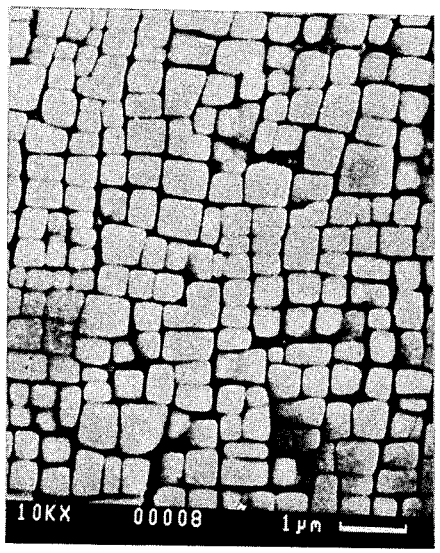
FIG. 2 is a sectional micrograph of a single crystal alloy made in accordance with a preferred embodiment of the invention.

As illustrated in FIG. 2, the completed article typically primarily comprises two phases, a precipitate formed within a matrix. The microstructure may also contain minor amounts of a eutectic region formed during solidification of the article and not removed during subsequent heat treatment procedures. The eutectic region may not be of the same crystallographic orientation as the matrix. As with the presence of low angle boundaries and small, isolated regions of polycrystalline matrix, small volume fractions of eutectic material are tolerated within a single crystal material.

It is a critical limitation that the present article be a single crystal, as that term is used herein. In prior polycrystalline articles to be used in high temperature service such as gas turbine components, special care and attention was devoted to strengthening the grain boundaries between the grains or crystals, as well as strengthening the individual grains themselves. Because &he article of &he present invention is composed of a single crystal, alloying additions to the article have been modified substantially. It is not necessary to provide strengthening for non-existent grain boundaries in such a single crystal article. The composition of the present single crystal article is therefore optimized for fabrication and use as a single crystal, and would not be suitable in a polycrystalline component.

Early in the development of gas turbines, gas turbine blades and vanes were fabricated by forging or ordinary casting procedures for use at relatively low temperatures, which left the components with a polycrystalline grain structure. As the performance of gas turbines was increased by operation of the turbines at higher temperatures, it was recognized that one technique for improving the performance of components was to control the grain structure, as a means of reducing failure by intergranular mechanisms. Techniques were developed to produce components having fewer grains than conventionally cast structures, and with the intergranular boundaries aligned parallel to the major stress axis to eliminate transverse intergranular paths.

Advanced casting techniques now allow the fabrication of single crystal components which are functional to higher operating temperatures than are polycrystalline components. The single crystal which form the components can be developed directly during casting of a liquid metal into a solid piece, or by a solid state transformation process in which a polycrystalline structure is transformed to a single crystal. The former is preferred, inasmuch as the formation of single crystals during solidification is more rapid and therefore more economical than is solid state formation, and also produces more perfect single crystals.

Any fabrication technique which produces a substantially single crystal article is operable in conjunction with the present invention. The preferred technique, used to prepare the single crystal articles described in the examples herein, is the gradient solidification method. Molten metal of the desired composition is placed into a heat& resistant ceramic mold having essentially the desired shape of the final fabricated component. The mold and metal contained therein are placed within a furnace, induction heating coil, or other heating device to melt the metal, and the mold and molten metal are gradually cooled in a temperature gradient. In this process, metal adjacent the cooler end of the mold solidifies first, and the interface between the solidified and liquid metal gradually moves through the metal as cooling continues. Such gradient solidification can be accomplished by placing a chill block adjacent one end of the mold and then turning off the heat source, allowing the mold and molten metal to cool and solidify in a temperature gradient. Alternatively, the mold and molten metal can be gradually withdrawn from the heat source.

It is found that certain crystallographic orientations such as (001) grow to the exclusion of others during such a gradient solidification process, so that a single grain becomes dominant throughout the article. Techniques have been developed to promote the formation of the single crystal orientation rapidly, so that substantially all of the article has the same single crystal orientation. Such techniques include seeding, described in U.S. Pat. 4,412,577 whereby an oriented single crystal starting material is positioned adjacent the metal first solidified, so that the metal initially develops that orientation. Another approach is a geometrical selection process such as described in U.S. Pat. 3,494,709, whose disclosure is incorporated by reference herein.

As indicated, all other techniques for forming a single crystal are acceptable for use in conjunction with the present invention. The floating zone technique may be used, wherein a molten zone is passed through a polycrystalline piece of metal to produce a moving solidification front. Solid state techniques are also permitted, wherein a solid piece of polycrystalline material is transformed to a single crystal in the solid state. The solid state approach is not preferred, because it is typically slow and produces a relatively imperfect single crystal.

The single crystal article of the invention has a composition in weight percent consisting essentially of from about 4 to about 6 percent chromium, from about 8 to about 12 percent cobalt, from about 1 to about 2.5 percent molybdenum, from about 3 to about 6 percent tungsten, from about 1.8 to about 3.2 percent rhenium, from about 0 to about 2.5 ruthenium, from about 5 to about 6 percent aluminum, from about 0.5 to about 1.5 percent titanium, from about 7 to about 10 percent tantalum, from about 0.08 to about 0.12 percent hafnium, balance nickel totaling 100 percent. Further, in such composition the sum of the molybdenum plus tungsten plus rhenium is from about 8.4 to about 10.4 percent, and the sum of aluminum plus titanium plus tantalum is about 13.8 to about 15.7 percent. The article is substantially free of vanadium, carbon, boron and zirconium.

These alloying elements are selected to achieve a cooperative optimization of the physical and chemical properties of the completed article, and to optimize the retention of such properties during the operating lifetime of the article. A primary consideration in the selection of the alloying ingredients is the attainment of creep strength and phase stability, and to achieve these ends the strengthening mechanisms of the single crystal article must be optimized. The preferred microstructure of the article, after heat treatment, is an array of precipitates in a matrix, as illustrated in FIG. 2. The matrix is nickel which has been strengthened by the addition of various solid-solution strengthening elements, and is termed gamma phase. Most elements have at least some solid solubility in nickel, but molybdenum, tungsten and rhenium have been found to be potent solid-solution strengtheners which do not have significant detrimental effects on other properties when used in controlled amounts, and in fact can promote the attainment of desirable properties. Molybdenum is present in a amount of from about 1 to about 2.5 weight percent, tungsten is present in an amount of from about 3 to about 6 weight percent, and rhenium is present in an amount of from about 1.8 to about 3.2 weight percent. The sum of these solid-solution strengthening elements should be from about 8.4 to about 10.4 percent. If too low a level of these alloying elements is used, the strength of the matrix is low. If excessively high levels are used, other properties such as hot corrosion resistance and oxidation resistance are reduced.

Rhenium has an additional benefit of refining the size of the precipitates, which contributes to improved strength of the gamma matrix. Rhenium also improves the creep strength of the gamma matrix and retards the rate of coarsening of the precipitates, during extended elevated temperature exposure. Ruthenium may optionally be substituted for rhenium in the alloy composition. It has been observed that ruthenium is not as potent a strengthening agent as rhenium, and therefore it is necessary to substitute a greater amount of ruthenium for rhenium, to achieve the same strengthening effect. On the other hand, ruthenium has a lower density and presently lower cost than rhenium, and it can therefore be cost effective to substitute greater amounts of ruthenium for rhenium.

Ruthenium has a lesser tendency to promote formation of the undesirable sigma phase, which will he discussed in more detail subsequently, than does rhenium. Nevertheless, in more preferred and most preferred compositions, no ruthenium is utilized in the alloy.

In addition to solid-solution strengthening, the strength of the single crystal article is promoted by precipitation hardening due to the presence of the precipitates in the matrix. The precipitates are formed as compounds of nickel, aluminum, titanium and tantalum, the compound being known as gamma-prime phase and having a composition conventionally represented as $Ni_3(Al,Ti,Ta)$. It is desirable that the volume fraction of the gamma-prime phase be maintained at a high level, preferably in the range of from about 65 to about 70 volume percent.

To achieve this quantity of the gamma-prime phase, aluminum is present in an amount of from about 5 to about 6 weight percent, titanium is present in an amount of from about 0.5 to about 1.5 weight percent, and tantalum is present in an amount of from about 7 to about 10 weight percent. If lower levels of these gamma-prime forming elements are utilized, the volume fraction of gamma-prime precipitate is low, with the result that the tensile and creep strengths are reduced below acceptable levels. If too high levels are used, the volume fraction of eutectic gamma-prime is excessively high. Since the eutectic gamma-prime is highly alloyed with elements that depress the melting temperature, the alloy becomes less responsive to a solution heat treat that dissolves all or most of the eutectic gamma-prime. Hence, the full potential strength of the alloy as a single crystal article cannot be realized. The tantalum content of the alloy is increased above the levels typically used in prior single crystal article alloy compositions that contain rhenium, to improve the rupture life of the alloy. The higher tantalum level also is effective in maintaining the desired volume fraction of the gamma-prime precipitate, while simultaneously holding the volume fraction of eutectic phase in the as-cast structure to below about 15 volume percent.

The sum of the aluminum plus titanium plus tantalum percentages is maintained in the range of from about 13.8 to about 15.7 weight percent. Lower levels result in the insufficient availability of gamma-prime forming elements, a low volume fraction of gamma-prime precipitate phase, and corresponding low strengths. Excessively high amounts of these three gamma-prime forming elements result in the formation of sigma phase, a brittle, undesirable precipitated constituent that may be formed during subsequent elevated temperature exposure of the article. It has been found that the simultaneous limitation of molybdenum plus tungsten plus rhenium to the range of from about 8.4 to about 10.4 percent, and the limitation of the sum of aluminum plus titanium plus tantalum to about 13.8 to about 15.7 percent, results in an optimum combination of strength of the article in creep loading, and chemical stability of the article to the formation of the undesirable sigma phase during extended elevated temperature exposure.

Chromium is present in the alloy in the amount of from about 4 to about 6 weight percent. The chromium promotes environmental resistance of the alloy to hot corrosion in the sulfur-containing hot gas of the gas turbine and to oxidation damage. Such inherent resistance to environmental damage is desirable in the article, even though it may be coated with a protective coating. Too low a level of chromium results in insufficient protection against environmental damage, while too high a level of chromium tends to promote formation of the undesirable brittle sigma phase.

Cobalt is present in the alloy in the amount of from about 8 to about 12 percent. This level of cobalt is generally higher than in prior nickel-base alloys for use in single crystal articles. The cobalt inhibits the formation of sigma phase containing chromium and rhenium, thus allowing these elements to be present for the reasons previously discussed. Too low a cobalt level has an insufficient inhibiting effect, while too high a cobalt level increases undesirably the solubility of the gamma-prime precipitates in the gamma matrix. Such increased solubility tends to reduce the volume fraction of the gamma-prime precipitates, thereby decreasing the strength of the article. However, it is found that, in combination with the ranges of the other alloying elements, the relatively higher level of cobalt is not detrimental in the present articles.

Hafnium is present in an amount of from about 0.08 to about 0.12 weight percent. Hafnium has been previously recognized as a grain boundary strengthening element, and it has therefore been conventional practice to eliminate hafnium from single crystal alloy articles. However, it has now been found that hafnium promotes resistance to environmental damage by oxidation. Thus, in combination with the other alloying elements in the indicated ranges, the presence of hafnium promotes optimized alloy performance.

Other grain boundary strengthening elements such as carbon, boron and zirconium are omitted from the present alloy, since their presence was previously necessary only to strengthen the grain boundaries. Such grain boundary strengtheners can produce brittle precipitates and also depress the melting point of the alloy. Although hafnium has been conventionally considered in this group of grain boundary strengthening elements, for use in the present alloy the other desirable attributes of hafnium have been recognized, with the result that hafnium is incorporated into the alloy. Vanadium is also omitted from the alloy, to improve the resistance to environmental damage during elevated temperature exposure. It is recognized that minor amounts of the omitted elements may be present as impurities at a trace level, and such very minor amounts are tolerated to the extent that they do not produce detrimental effects on the alloy and the properties of the single crystal articles.

Other relationships of the alloying ingredients have been altered, as compared with prior practice in the field of nickel-base single crystal alloy articles. The sum of the molybdenum and titanium additions has been reduced to enhance phase stability and to allow heat treatment in the manner to be described subsequently. The reduced level of alloying elements also reduces the decrease of the melting point of the alloy.

The ratio of tungsten to tantalum has also been reduced as compared with prior rhenium containing alloys to promote the castability of the alloy. A high ratio of tungsten to tantalum promotes freckling at the surface of the cast article, and reducing this ratio has the opposite effect. In the present alloy, the tungsten has been decreased and the tantalum increased, as compared with prior alloys, to reduce the ratio of tungsten to tantalum.

The selection of the ranges of the alloying elements also leads to an improved ability to heat treat the cast single crystal articles. In the process for preparing a single crystal article of the invention, an alloy of the desired composition is formed and then a single crystal is prepared from the alloy composition. Without further processing, the microstructure of the resulting single crystal contains gamma-prime precipitates (referred to as cooling gamma-prime) having a variety of sizes. A further solution treat and age heat treatment procedure is performed, wherein the material in the gamma-prime precipitate phase is dissolved into the gamma matrix in solution heat treatment, and then reprecipitated in an aging treatment conducted at a lower temperature.

To place the gamma-prime phase into solution, the single crystal piece must be heated to a temperature which is greater than the solvus temperature of the gamma-prime phase, but less than the melting temperature of the alloy. The melting temperature, termed the solidus for a composition which melts over a temperature range, should be sufficiently greater than the solvus temperature so that the single crystal piece may be heated and maintained within the temperature range between the solvus and the solidus for a time sufficiently long to dissolve the gamma-prime precipitate phase into the gamma matrix. As an example, if this difference between the solvus temperature and the solidus temperature were only about 5° F., it would not be commercially practical using existing heat treatment apparatus to maintain the single crystal article within the range for the several hour period necessary to dissolve the gamma-prime precipitate articles. The solidus temperature is typically about 2,400 to 2,450 ° F. and accurate control to within a few degrees in commercial heat treating equipment is simply not possible. It is therefore preferred that the solidus be at least about 15 ° F. greater than the solvus temperature for the gamma-prime precipitates.

Both the solvus temperature and solidus temperature are altered by changes in the amounts of the elements contained within the alloy. Generally, greater amounts of the alloying elements reduce the solidus temperature and cause it to approach the solvus temperature, thereby making commercial heat treatment procedures impractical to perform. The composition of the present alloy has been selected with this consideration in mind, and the reduced levels of molybdenum, titanium, carbon, boron, zirconium, vanadium and tungsten all reduce the depression of the solidus temperature, largely without detrimental effects on other properties.

As may be seen in the examples presented subsequently, the "heat treat window" or difference between the gamma-prime solvus and the alloy solidus temperatures is maintained at least at 15° F., and preferably greater than about 50° F. In the preferred heat treatment of the cast single crystal articles, the articles are solution heat treated at a temperature of about 2,415° F. for a period of about three hours, to dissolve the gamma-prime precipitate phase formed during solidification, into the gamma matrix. The solution heat treatment may be accomplished at any temperature within the heat treatment window between the gamma-prime solvus and the solidus temperatures. Greater temperatures allow shorter heat treatment times. However, the heat treatment temperature is not typically pushed to a maximum level, to allow a margin of error in the heat treatment equipment. After the heat treating is completed, the solution heat treated single crystal articles are cooled to supersaturate the matrix with the gamma-prime forming elements. A fast argon fan cool to a temperature of less than about 1,000° F. has been found sufficient to achieve the necessary supersaturation. Excessively high cooling rates may not be achieved in all commercial heat treat furnaces, while excessively low cooling rates would not provide the necessary supersaturation.

Following the solution heat treatment and supersaturation cooling, the solution heat treated single crystal articles are aged to precipitate the gamma-prime precipitates within the single crystal gamma matrix. The aging heat treatment can be combined with the coating treatment. As noted previously, gas turbine components are typically coated with a corrosion resistant and oxidation resistant coating prior to use. During the coating procedure, the article being coated is heated to elevated temperature. A typical coating treatment requires heating the article to a temperature of about 1,950° F. for about four hours. This heat treatment causes some precipitation of the gamma-prime phase within the gamma matrix, thus accomplishing in part the aging heat treatment. The aging heat treatment may be completed by a further elevated temperature exposure, separate from the coating procedure. A sufficient additional aging heat treatment is accomplished at a temperature of about 1,600° F. for a time of about twenty hours, following the heat treatment at 1,950° F. for four hours. The aging heat treatment is not limited to this preferred heat treatment sequence, but instead may be accomplished by any acceptable approach which precipitates the desired volume fraction of gamma-prime particles within the gamma matrix, the precipitation occurring from the supersaturated heat treated single crystal matrix.

The microstructure of the as-solidified single crystals includes irregular gamma-prime particles and regions of gamma-prime eutectic material. The solution heat treatment dissolves the irregular gamma-prime particles and most or all of the gamma-prime eutectic constituent into the gamma matrix. The subsequent aging treatment precipitates an array of gamma-prime precipitates having a generally regular shape and somewhat uniform size. The gamma-prime precipitates illustrated in FIG. 2 vary from about 0.3 to about 0.7 micrometers in size.

Based upon an evaluation of alloys prepared in accordance with the invention, preferred and most preferred ranges of the alloying elements have been determined. The evaluation procedures are described in connection with the Examples to be presented subsequently. In the preferred single crystal article, the composition in weight percent consists essentially of from about 4.6 to about 5.6 percent chromium, from about 9.7 to about 10.3 cobalt, from about 1.4 to about 2.0 percent molybdenum, from about 4.8 to about 5.2 percent tungsten, from about 2.8 to about 3.2 percent rhenium, from about 5.3 to about 5.7 percent aluminum, from about 0.5 to about 1.0 percent titanium, from about 8.0 to about 9.0 percent tantalum, from about 0.008 to about 0.12 percent hafnium, balance nickel, wherein the sum of molybdenum plus tungsten plus rhenium is from about 8.4 to about 10.4 percent and the sum of aluminum plus titanium plus tantalum is from about 13.8 to about 15.7 percent, the article being substantially free of vanadium, carbon, boron and zirconium. It is found that this preferred range, being within the broader range of the invention, produces its benefits and in addition achieves improved creep properties and phase stability as compared with those of prior single crystal alloy articles.

The most preferred composition, which has the closest limits on composition and achieves the optimum properties, includes chromium of about 4.8 percent, cobalt of about 10.0 percent, molybdenum of about 1.5 to about 2.1 percent, tungsten of about 4.8 percent, rhenium of about 2.9 percent, aluminum of about 5.2 to about 5.5 percent, titanium of about 0.5 to about 1.1 percent, tantalum from about 8.0 to about 9.0 percent, and hafnium of about 0.10 percent, balance nickel, wherein the sum of aluminum plus titanium plus tantalum does not exceed about 15.0 percent, the articles being substantially free of vanadium, carbon, boron and zirconium.

The articles of the preferred and most preferred compositions are prepared by the process described previously, including the preparation of a single crystal article from the alloy, and solution heat treating and aging the single crystal article.

The following Examples are presented to illustrate aspects and features of the present invention, and are not to be taken as limiting the invention in any respect.

EXAMPLE 1

Alloys were prepared having the compositions set forth in table 1.

TABLE 1

| ALLOY | ANALYZED COMPOSITIONS OF ALLOYS (Weight Percent) | | | | | | | | | | |
|---|---|---|---|---|---|---|---|---|---|---|---|
| | Cr | Co | Mo | W | Re | Ru | Al | Ti | Ta | Hf | Ni |
| A | 5.61 | 9.9 | 1.53 | 5.05 | 2.90 | — | 5.34 | 1.03 | 8.4 | 0.10 | bal. |
| B | 5.65 | 9.9 | 2.08 | 5.10 | 2.94 | — | 5.45 | 0.52 | 8.7 | — | bal. |

TABLE 1-continued
ANALYZED COMPOSITIONS OF ALLOYS
(Weight Percent)

| ALLOY | Cr | Co | Mo | W | Re | Ru | Al | Ti | Ta | Hf | Ni |
|---|---|---|---|---|---|---|---|---|---|---|---|
| C | 5.56 | 10.0 | 1.50 | 5.09 | 2.90 | — | 5.29 | 0.52 | 9.0 | 0.10 | bal. |
| D | 5.51 | 9.8 | 1.58 | 5.08 | 1.95 | 1.5 | 5.46 | 1.06 | 7.8 | — | bal. |
| E | 5.62 | 9.9 | 2.02 | 5.07 | 1.94 | 1.2 | 5.47 | 0.52 | 8.4 | 0.18 | bal. |
| F | 5.60 | 10.1 | 1.62 | 5.13 | 1.86 | 2.0 | 5.56 | 0.51 | 8.5 | 0.13 | bal. |
| G | 5.59 | 9.9 | 1.69 | 5.08 | 2.52 | 0.6 | 5.40 | 0.75 | 8.4 | 0.07 | bal. |
| H | 5.76 | 10.6 | 2.00 | 5.48 | 2.59 | — | 5.81 | 1.02 | 9.6 | 0.11 | bal. |
| I | 5.91 | 10.5 | 1.49 | 4.51 | 3.42 | — | 5.81 | 1.01 | 9.8 | 0.10 | bal. |
| J | 5.32 | 10.1 | 1.79 | 4.73 | 3.05 | — | 5.51 | 0.75 | 9.3 | 0.10 | bal. |
| K | 4.71 | 9.9 | 1.93 | 4.85 | 2.92 | — | 5.39 | 1.00 | 8.3 | 0.09 | bal. |
| L | 5.21 | 10.1 | 2.00 | 4.95 | 2.89 | — | 5.57 | 0.79 | 7.7 | 0.08 | bal. |
| M | 5.84 | 10.6 | 1.75 | 5.00 | 3.01 | — | 5.81 | 1.02 | 9.7 | 0.10 | bal. |

Single crystal articles were prepared by casting each alloy into a mold. Each mold has provision for forming multiple articles, specifically twenty cylindrical test bars, each having a diameter of ⅜ inches and a length of 4.5 inches and four gas turbine blades having a configuration generally similar to that illustrated in FIG. 1. The liquid metal alloy in the mold was solidified as a single crystal using the gradient solidification technique previously described, wherein the mold is placed upon a water cooled chill block inside a furnace operating at temperature greater than the liquidus temperature for the alloy. After the alloy is fully melted, the mold was withdrawn from the furnace and the metal within the mold gradually solidified unidirectionally from the part nearest the chill block. After solidification, the mold was cooled and broken open to remove the cast metal pieces.

Samples of each alloy were heated to various temperatures to determine the gamma-prime solvus temperature and the incipient melting temperature, corresponding to the solidus temperature. Table 2 presents the temperatures determined by this procedure, and indicates the size of the heat treat window.

TABLE 2
RESULTS OF HEAT TREAT STUDY

| ALLOY | VOL. PERCENT EUTECTIC GAMMA PRIME | GAMMA PRIME SOLVUS TEMPERATURE | INCIPIENT MELTING TEMPERATURE | HEAT TREAT WINDOW |
|---|---|---|---|---|
| A | 11.0 | 2390 | 2425 | +35 |
| B | 10.6 | 2375 | 2435 | +60 |
| C | 9.7 | 2375 | 2435 | +60 |
| D | 11.6 | 2375 | 2435 | +60 |
| E | 10.1 | 2375 | 2435 | +60 |
| F | 11.0 | 2375 | 2435 | +60 |
| G | 10.7 | 2375 | 2435 | +60 |
| H | 20.5 | 2400 | 2415 | +15 |
| I | 20.7 | 2415 | 2435 | +20 |
| J | 13.6 | 2390 | 2435 | +45 |
| K | 11.8 | 2375 | 2440 | +65 |
| L | 11.1 | 2375 | 2440 | +65 |
| M | 20.6 | 2400 | 2415 | +15 |

(All temperatures herein are °F.)

The potential creep and stress rupture strengths of a single crystal superalloy can be obtained after performing a solution heat treatment that dissolved the coarse cooling gamma-prime phase. Table 2 indicates that all the alloys of the invention exhibit a minimum of 15° F. for the heat treat window. This is considered to be compatible with the capabilities of commercial heat treat furnaces. In this respect, alloys of the present invention are an improvement over prior art. For example, in U.S. Pat. 4,371,404 the preferred alloy 231 exhibits a heat treat window of 5° F., which makes the alloy impossible to solution heat treat in commercial furnaces.

Table 2 further shows that alloys H, I and M whose compositions are outside of the restrictive composition claims exhibit the smallest heat treat window. Although the tantalum content of alloys J and L is outside the restricted tantalum range, the heat treat window is still greater than that of alloys H, I and M. This result is related to the volume fraction of eutectic gamma prime phase present in the as-solidified structure. Table 2 indicates that alloys containing less than about 15 in volume percent of eutectic phase have a heat treat window greater than 20° F. In industrial practice, a large heat treat window is desirable for solution treatment of the airfoils. Table 2 demonstrates that combinations of gamma prime forming elements such as aluminum, titanium and tantalum can have a dramatic effect on the heat treat window, which has not been previously recognized. In the present invention, the sum of aluminum plus titanium plus tantalum is limited to 15.7 weight percent to ensure that the volume fraction of the eutectic is less than about 15 volume percent and the volume fraction of the gamma prime phase is in the range of from about 65 to about 70 volume percent.

The preferred alloys such as A, B, C, and K may be solution heat treated in the range of about 2390 ° F. to about 2415 ° F., and a temperature of 2415 ° F. was chosen as the maximum solution temperature for further work. Because of this choice, alloys H and M are expected to exhibit a small amount of incipient melting. The remaining &est material was solution heat treated at 2415° F. for three hours in an argon atmosphere and then cooled to below 1000° F. by a fast argon fan cooling to create a supersaturated gamma matrix. Samples were taken for metallographic evaluation, and it was determined that the solution heat treatment had placed almost all of the eutectic gamma-prime phase into solution. As expected, alloys H and M show some degree of incipient melting.

Following the solution heat treatment and cooling, the test material was given a heat treatment to simulate a coating procedure, even though no coating was actually applied to the test material. The simulated coating treatment utilized heating the test materials to a temperature of about 1950° F. for a period of four hours. The test material was then aged in argon at a temperature of 1600° F. for twenty hours. FIG. 2 illustrates a typical microstructure of the solution treated and aged single crystal material. The gamma-prime precipitate occupies at least about 65 volume percent, and has a generally cubic morphology with a characteristic dimension along one edge of the cube of from about 0.3 to about 0.7 micrometers.

EXAMPLE 2

Samples of the solution treated and aged single crystal articles prepared in Example 1 were tested to determined mechanical properties. Cylindrical tensile test specimens having a gauge diameter of 0.160 inches and a total length of 2 inches were machined. The samples were tested in creep rupture tests. Table 3 presents the results of creep rupture testing conducted at 1800° F. and a loading of 36,000 pounds per square inch. Tests were conducted by applying a dead weight loading to the sample in a furnace at the indicated temperature.

TABLE 3

RESULTS OF CREEP RUPTURE TESTING AT 1800° F.-36,000 PSI

| ALLOY | SPEC-IMEN NO. | TIME (HOURS) TO: 1% CREEP | 2% CREEP | RUPTURE LIFE (HOURS) | % El. | % RA |
|---|---|---|---|---|---|---|
| A | A-3 | 70.0 | 103.4 | 188.0 | 28.5 | 35.3 |
|   | A-4 | 85.0 | 110.6 | 183.5 | 20.6 | 35.4 |
| B | B-3 | 67.0 | 98.6 | 178.7 | 23.2 | 30.5 |
|   | B-4 | 66.0 | 97.5 | 181.5 | 24.0 | 32.5 |
| C | C-3 | 70.0 | 97.5 | 180.4 | 25.4 | 39.7 |
|   | C-4 | 65.0 | 98.1 | 177.9 | 21.9 | 36.5 |
| D | D-3 | 11.0 | 26.5 | 141.5 | 23.9 | 35.5 |
|   | D-4 | 46.0 | 72.2 | 140.4 | 20.4 | 33.4 |
| E | E-3 | 26.0 | 106.3 | 152.5 | 35.6 | 39.5 |
|   | E-4 | 33.0 | 67.4 | 150.8 | 26.2 | 39.1 |
| F | F-3 | 42.5 | 67.4 | 136.0 | 23.1 | 41.8 |
|   | F-4 | 32.5 | 59.9 | 138.4 | 34.3 | 35.8 |
| G | G-3 | 58.0 | 88.6 | 162.3 | 21.1 | 34.1 |
|   | G-4 | 56.0 | 82.7 | 151.3 | 25.2 | 33.2 |
| H | H-3 | 47.0 | 65.5 | 131.1 | 25.1 | 28.4 |
|   | H-4 | 47.0 | 68.0 | 136.4 | 21.9 | 34.5 |
| I | I-3 | 109.0 | 137.5 | 233.7 | 26.5 | 33.6 |
|   | I-4 | 71.5 | 121.0 | 232.7 | 30.8 | 29.6 |
| J | J-3 | 51.0 | 97.0 | 194.8 | 28.7 | 34.7 |
|   | J-4 | 49.0 | 98.0 | 199.4 | 27.6 | 34.7 |
| K | K-3 | 37.0 | 71.0 | 148.6 | 24.0 | 27.1 |
|   | K-4 | 35.5 | 68.5 | 139.3 | 22.8 | 25.0 |
| L | L-3 | 34.5 | 62.5 | 131.4 | 31.6 | 36.6 |
|   | L-4 | —(*) | —(*) | 124.2 | 25.0 | 37.4 |
| M | M-3 | 87.0 | 112.5 | 197.7 | 26.3 | 32.3 |
|   | M-4 | 72.5 | 104.5 | 200.4 | 33.7 | 31.3 |

*No measurement due to extensometer failure.

Another group of samples were tested in similar creep rupture testing, except at a temperature of 2000° F. and a tensile loading of 18,000 pounds per square inch. The results are presented in Table 4:

TABLE 4

RESULTS OF CREEP RUPTURE TESTING AT 2000° F. - 18,000 PSI

| ALLOY | SPEC-IMEN NO. | TIME (HOURS) TO: 1% CREEP | 2% CREEP | RUPTURE LIFE (HOURS) | % El. | % RA |
|---|---|---|---|---|---|---|
| A | A-5 | —(*) | —(*) | 249.9(+) | — | — |
|   | A-6 | 14.0 | 52.8 | 290.3 | 10.3 | 28.4 |
| B | B-5 | 18.0 | 123.8 | 314.1 | 14.1 | 23.8 |
|   | B-6 | 17.5 | 53.9 | 328.7 | 14.8 | 24.5 |
| C | C-5 | 85.0 | 192.0 | 229.1 | 12.4 | 21.1 |
|   | C-6 | 114.5 | 195.1 | 224.4 | 11.6 | 29.6 |
| D | D-5 | 18.5 | 73.0 | 130.1 | 14.7 | 20.6 |
|   | D-6 | 47.0 | 84.2 | 115.3 | 13.5 | 22.8 |
| E | E-5 | 22.5 | 133.4 | 205.4 | 7.1 | 20.8 |
|   | E-6 | 26.5 | 145.7 | 230.7 | 8.8 | 23.7 |
| F | F-5 | 10.0 | 18.1 | 105.6 | 24.8 | 31.4 |
|   | F-6 | 27.0 | 68.5 | 110.2 | 16.5 | 29.3 |
| G | G-5 | 27.0 | 131.1 | 211.7 | 11.2 | 23.9 |
| H | H-5 | 22.0 | 36.5 | 73.5 | 30.1 | 34.4 |
|   | H-6 | 24.5 | 39.5 | 77.4 | 26.0 | 33.4 |
| I | I-5 | 89.0 | 131.0 | 189.1 | 30.3 | 31.4 |
|   | I-6 | —(*) | —(*) | 177.1 | 24.7 | 30.6 |

TABLE 4-continued

RESULTS OF CREEP RUPTURE TESTING AT 2000° F. - 18,000 PSI

| ALLOY | SPEC-IMEN NO. | TIME (HOURS) TO: 1% CREEP | 2% CREEP | RUPTURE LIFE (HOURS) | % El. | % RA |
|---|---|---|---|---|---|---|
| J | J-5 | —(*) | —(*) | 251.4 | 11.3 | 26.3 |
|   | J-6 | 51.0 | 228.0 | 364.6 | 14.5 | 24.1 |
| K | K-5 | 32.5 | 76.5 | 138.4 | 21.6 | 30.3 |
|   | K-6 | 30.5 | 87.6 | 125.4 | 13.1 | 28.4 |
| L | L-5 | 54.0 | 112.0 | 145.3 | 14.8 | 30.1 |
|   | L-6 | 32.0 | 92.5 | 146.5 | 10.9 | 28.4 |
| M | M-5 | 35.5 | 79.5 | 136.5 | 29.8 | 36.4 |
|   | M-6 | 59.0 | 82.0 | 129.6 | 31.8 | 35.5 |

(*)No measurement due to extensometer failure.
(+)Specimen pulled out of adapter at time indicated. No Failure.

The rupture life of alloy H at 2000° F. and 18,000 psi is lower than that of the other alloys, as a result of incipient melting.

For comparison purposes, creep rupture testing was performed on a known directionally solidified turbine blade material, DS Mar-M247. The directionally solidified columnar grained samples were solution heat treated at 2230° F. for three hours and then aged at 1600° F. for twenty hours. The results of the creep rupture testing of DS Mar-M247 are presented in Table 5:

TABLE 5

RESULTS OF CREEP RUPTURE TESTING OF DS Mar-M247

| SPECMEN | CONDITIONS | TIME (HOURS) TO: 1% CREEP | 2% CREEP | RUPTURE LIFE (HOURS) | % El. | % RA |
|---|---|---|---|---|---|---|
| M-2 | 1800° F.-36,000 psi | 8.3 | 17.2 | 39.7 | 24.5 | 38.4 |
| M-3 | 1800° F.-36,000 psi | 7.9 | 14.0 | 32.4 | 28.5 | 48.7 |
| M-6 | 2000° F.-18,000 psi | 4.0 | 10.4 | 20.4 | 29.5 | 59.7 |

As may be seen by comparing the alloys of the invention with the results of the creep rupture testing under similar conditions, the present alloys produced significantly improved results as compared with the DS Mar-M247.

EXAMPLE 3

Samples of each of the alloys prepared as described in Example 1 were placed into furnace operating at 1800° F. for 500 hours. Samples were then sectioned and evaluated by light microscopy. Samples of the materials tested under creep rupture testing and reported in Example 2 were also sectioned and examined. Both methods were used to determine the phase stability of the alloys.

Alloys which contain ruthenium, e.g. alloys D, E, F, and G do not exhibit any sigma phase. Alloys of the preferred embodiment are phase stable whereas alloys H, I and M are unstable with respect to sigma precipitation. The limits of phase stability of alloys of the invention are further defined by reference to FIGS. 3 and 4.

Figure 3:
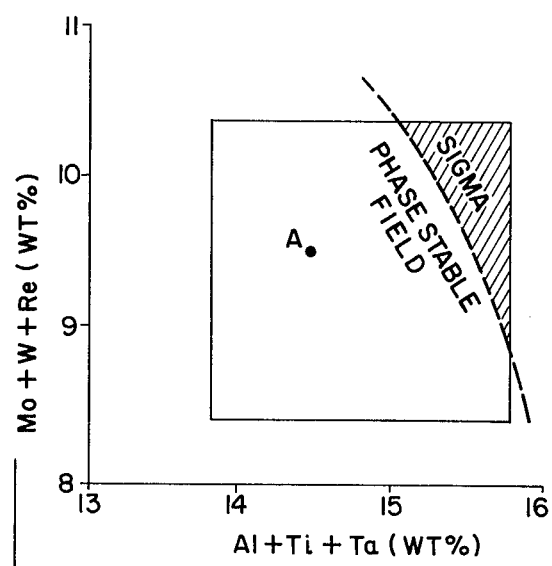
FIG. 3 is a graph of the phase stability field of alloys with the sum of chromium and cobalt equal to 15.5 weight percent.

In FIG. 3 the lines defining a box delineate the limits of the sum of aluminum plus titanium plus tantalum and the sum of molybdenum plus tungsten plus rhenium. Also drawn in FIG. 3 is the boundary that separates the phase stable field from the sigma-prone field. FIG. 3 shows the extent of the phase stability field for single crystal superalloy compositions for which the sum of chromium plus cobalt is 15.5 weight percent. Alloy compositions, such as that of Alloy A, located to the left hand side of the boundary are phase stable.

Figure 4:
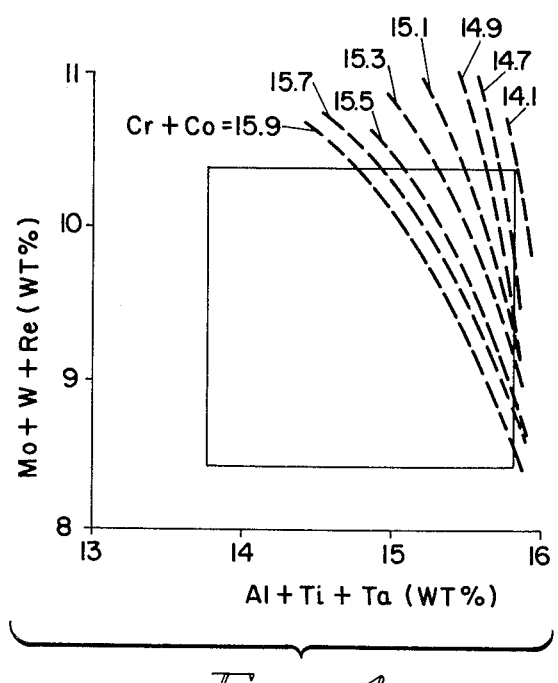
FIG. 4 is a graph of the phase stability field of alloys with various sums of chromium and cobalt.

FIG. 4 is similar to FIGURE 3, except that the boundary between the phase stable and sigma-prone fields has been drawn with the sum of chromium and cobalt as a parameter. It can be seen that as the sum of chromium and cobalt decreases, the phase stable field increases. It can be readily seen that the compositions of alloys H, I and M are phase unstable because their compositions are located to the right hand side of their respective phase stability limit boundary. FIG. 4 provides a useful means to identify a phase stable alloy composition. The steps involved are as follows.

First, compute the sum of chromium plus cobalt, then locate the corresponding phase stability limit boundary in FIG. 4. Second, compute the sum of aluminum plus titanium plus tantalum and the sum of molybdenum plus tungsten plus rhenium to locate the point representing the composition of the alloy in FIG. 4 Third if the composition is located to the left hand side of the corresponding phase stability limit boundary, then the composition is determined to be phase stable.

This approach to the optimization is unique, inasmuch as the art has not recognized this or a similar approach for avoiding phase instability. The present composition limits define acceptable ranges of phase stability in the alloys, which is a consideration equally important to mechanical properties.

EXAMPLE 4

Test samples from alloys A, B and C and another single crystal alloy named CMSX-2 +Hf were coated with an overlay coating applied by the low pressure plasma spray process. CMSX-2 is a single crystal superalloy disclosed in European Pat. No. 0052911 and considered for use in many gas turbine engine applications. The test consisted of subjecting the coated samples to repeated cycles of 57 minutes at 2200° F. followed by 3 minutes of fast air cool blast. The test results shown in Table 6 indicate that the coated oxidation resistance of the alloys of the invention is superior to that of the current art.

TABLE 6
RESULTS OF COATED OXIDATION TESTING

| ALLOY | SPECIMEN NO. | TIME IN TEST (HRS.) | COMMENTS |
|---|---|---|---|
| A | A-1 | 200 | NO FAILURE |
| B | B-2 | 250 | FAILED |
| C | C-2 | 206 | FAILED |
| CMSX-2 + Hf | Z-101 | 140 | FAILED |
|  | 840X-1 | 150 | FAILED |

EXAMPLE 5

Alloys cited in the previous examples were obtained as small laboratory heats weighing 35 pounds. For Example 5, one heat weighing 500 pounds was melted by a commercial alloy supplier.

The chemical analysis (in weight percent) of this heat is as follows:
4.8 Cr—10.0 Co—1.63 Mo—4.8 W—2.95 Re—5.5 Al—0.72 Ti—8.1 Ta—0.10 Hf—bal. Ni.
The following sums can be calculated:
Cr +Co =14.8 weight percent
Mo +W +Re =9.38 weight percent
Al +Ti +Ta =14.3 weight percent Referring to FIG. 4, it can be seen that the point representing the composition of this heat is located to the left hand side of the phase stability limit curve for Cr +Co TM 14.8. Hence this heat is expected to be phase stable, which was confirmed by the absence of sigma phase in the failed stress rupture specimens. Stress rupture tests were conducted on test samples machined from single crystal test bars solution heat treated at 2415° F. and aged as in Example 2.

Table 7 shows that the stress rupture test results are similar to those of the alloys of Example 2.

TABLE 7
RESULTS OF STRESS RUPTURE TESTS

| SPECIMEN | CONDITIONS | RUPTURE LIFE (HOURS) | % El. | % RA |
|---|---|---|---|---|
| 292A | 1800° F.-36,000 psi | 222.9 | 30.1 | 37.4 |
| 292B | 1800° F.-36,000 psi | 237.9 | 35.7 | 36.4 |
| 292C | 2000° F.-18,000 psi | 302.8 | 9.5 | 18.7 |
| 292D | 2000° F.-18,000 psi | 333.1 | 22.8 | 26.1 |

The alloy Of the present invention is superior to prior alloys, as the following Table 8 demonstrates.

TABLE 8
COMPARISON OF STRESS RUPTURE LIVES (HOURS)

| Alloy | Reference | 1800° F.-36,000 psi | 2000° F.-18,000 psi |
|---|---|---|---|
| 392 | UK 1,557,900 UK 1,562,082 | 120 | 89 |
| A | US 4,388,124 | 80 | 62 |
| E | US 4,388,124 | 89 | 130 |
| Ex. 5 | Present Invention | 230 | 318 |

The alloy of the present invention exhibits significantly better stress rupture lives than those of the reference patents.

It will now be appreciated that, through the use of this invention, nickel-base superalloy single crystal articles such as gas turbine blades and vanes may be readily prepared. Such articles have mechanical, phase stability and environmental properties superior to those of prior nickel-base single crystal alloy materials. Although particular embodiments of the invention have been described in detail for purposes of illustration, various modifications may be made without departing from the spirit and scope of the invention. Accordingly, the invention is not to be limited except as by the appended claims.

What is claimed is:

1. A nickel-base .superalloy single crystal article, comprising a a single crystal having a composition in weight percent consisting essentially of from about 4 to about 6 percent chromium, from about 8 to about 12 percent cobalt, from about 1 to about 2.5 percent molybdenum, from about 3 to about 6 percent tungsten, from about 1.8 to about 3.42 percent rhenium, from about 0 to about 2.5 percent ruthenium, from about 5 to about 6 percent aluminum, from about 0.5 to about 1.5 percent titanium, from about 7.7 to about 10 percent tantalum, from about 0.08 to about 0.18 percent hafnium, balance nickel, wherein the sum of molybdenum plus tungsten plus rhenium is from about 8.4 to about 10.4 percent and the sum of aluminum plus titanium plus tantalum is from about 13.8 to about 15.7 percent, said article being substantially free of vanadium, carbon, boron and zirconium.

2. The article of claim 1, wherein said article is a turbine blade.

3. The article of claim 1, wherein said article is a turbine vane.

4. The article of claim i wherein said article has a microstructure comprising a distribution of gamma prime particles in a gamma matrix.

5. A nickel-base superalloy single crystal article, comprising a single crystal having a composition in weight percent consisting essentially of from about 4.6 to about 5.6 percent chromium, from about 9.7 to about 10.3 percent cobalt, from about 1.4 to about 2.0 percent molybdenum, from about 4.8 to about 5.2 percent tungsten, from about 2.8 to about 3.2 percent rhenium, from about 5.3 to about 5.7 percent aluminum, from about 0.5 to about 1.0 percent titanium, from about 8.0 to about 9.0 percent tantalum, from about 0.08 to about 0.12 percent hafnium, balance nickel, wherein the the sum of molybdenum plus tungsten plus rhenium is from about 8.4 to from about 10.4 percent and the sum of aluminum plus titanium plus tantalum is about 13.8 to about 15.7 percent, said article being substantially free of vanadium, carbon, boron and zirconium.

6. The article of claim 5, wherein said article is a turbine blade.

7. The article of claim 5, wherein said article is a turbine vane.

8. The article of claim 5, wherein said article has a microstructure comprising a distribution of gamma prime particles in a gamma matrix.

9. The article of claim 5, wherein the chromium is about 4.8 percent, the cobalt is about 10.0 percent, the molybdenum is from about 1.5 to about 2.1 percent, the tungsten is about 4.8 percent, the rhenium is about 2.9 percent, the aluminum is from about 5.2 to about 5.5 percent, and the hafnium is about 0.10 percent, and the sum of aluminum plus titanium plus tantalum does not exceed about 15.0 percent.

10. A process for preparing a nickel-base superalloy single crystal article, comprising the steps of:
furnishing an alloy consisting essentially of from about 4 to about 6 percent chromium, from about 1 to about 12 percent cobalt, from about 1 to about 2.5 percent molybdenum, from about 3 to about 6 percent tungsten, from about 1.8 to about 3.42 percent rhenium, from about 0 to about 2.5 percent ruthenium, from about 5 to about 6 percent aluminum, from about 0.5 to about 1.5 percent titanium, from about 7.7 to about 10 percent tantalum, from about 0.08 to about 0.18 percent hafnium, balance nickel, wherein the sum of molybdenum plus tungsten plus rhenium is from about 8.4 to about 10.4 percent and the sum of aluminum plus titanium plus tantalum is about 13.8 to about 15.7 percent, said article being substantially free of vanadium, carbon, boron and zirconium; and
preparing a single crystal article from the alloy.

11. The process of claim 10, wherein the article is a turbine blade.

12. The process of claim 10, wherein the article is a turbine vane.

13. The process of claim 10, including the further steps of:
solution treating the prepared single crystal article at a temperature of greater than the gamma prime solvus;
cooling the article to create a supersaturated matrix; and
aging the solution treated and cooled article at a temperature below the gamma prime solvus to produce a microstructure comprising a distribution of gamma prime particles in a gamma matrix.

14. The process of claim 10, including the further step of:
coating the prepared single crystal with a protective coating.

15. The process of claim 10, wherein the major axis of the prepared single crystal is substantially parallel to the (001) crystallographic orientation.

16. The article of claim 1 wherein:
chromium is about 4.71 to 5.91 percent,
cobalt is about 9.8 to 10.6 percent,
molybdenum is about 1.49 to 2.08 percent,
tungsten is about 4.51 to 5.48 percent,
rhenium is about 1.86 to 3.42 percent,
ruthenium is about 0 to 2.0 percent,
aluminum is about 5.29 to 5.81 percent,
titanium is about 0.51 to 1.06 percent, and
tantalum is about 7.7 to 9.8 percent.

17. The article of claim 1 wherein:
chromium is about 4.71 to 5.65 percent,
cobalt is about 9.8 to 10.1 percent,
molybdenum is about 1.50 to 2.08 percent,
tungsten is about 4.73 to 5.13 percent,
rhenium is about 1.86 to 3.05 percent,
aluminum is about 5.29 to 5.57 percent, and
tantalum is about 7.7 to 9.3 percent.

18. The article of claim 16 wherein:
cobalt is about 9.9 to 10.0 percent,
tungsten is about 4.8 to 5.1 percent,
rhenium is about 2.90 to 2.95 percent,
aluminum is about 5.29 to 5.50 percent,
titanium is about 0.52 to 1.03 percent, and
tantalum is about 8.1 to 9.0 percent.

19. The article of claim 16 wherein:
chromium is about 5.51 to 5.62 percent,
molybdenum is about 1.58 to 2.02 percent,
tungsten is about 5.07 to 5.13 percent,
rhenium is about 1.86 to 2.52 percent,
ruthenium is about 0.6 to 2.0 percent,
aluminum is about 5.40 to 5.56 percent, and
tantalum is about 7.8 to 8.5 percent.

20. The nickel-base superalloy composition, particularly suited for fabrication of single crystal articles, consisting essentially of about:
4.0 to 5.6 percent chromium,
8.0 to 12.0 percent cobalt,
1.0 to 2.0 percent molydenum,
3.0 to 5.2 percent tungsten,
1.8 to 3.2 percent rhenium,
0 to 2.5 percent ruthenium,
5.0 to 6.0 percent aluminum,
0.5 to 1.5 percent titanium,
7.7 to 10.0 percent tantalun,
0.08 to 0.18 percent halfnium,
the balance essentially nickel with usual impurities and wherein the sum of molydenum plus tungsten plus rhenium is from about 8.4 to about 10.4 percent and the sum of aluminum plus titanium plus tantalum is from about 13.8 to 15.7 percent.

21. The composition of claim 20 wherein:
chromium is about 5.0 to 5.6,
cobalt is about 9.7 to 10.3,
molydenum is about 1.4 to 2.0, tungsten is about 4.8 to 5.2,
rhenium is about 2.8 to 3.2,
ruthenium is about 0 to 2.0,
aluminum is about 5.0 to 5.4,
titanium is about 0.5 to 1.1,
tantalim is about 8.0 to 9.0, and
halfnium is about 0.08 to 0.12 percent.
22. The composition of claim 21 wherein:
chromium is about 5.3,
cobalt is about 10.0,
molydenum is about 1.7,
tungsten is about 5.0,
rhenium is about 3.0,
aluminum is about 5.2,
titanium is about 1.0,
tantalim is about 8.5 and
halfnium is about 0.01 percent.
23. The composition of claim 21 wherein:
chromium is about 5.6,
cobalt is about 10.0,
molydenum is about 1.5,
tungsten is about 5.0
rhenium is about 3.0
aluminum is about 5.3
titanium is about 1.0
tantalim is about 8.1 and
halfnium is about 0.1 percent.
24. The composition of claim 20 wherein:
chromium is about 5.2,
cobalt is about 10.1,
molydenum is about 2.0,
tungsten is about 5.0
rhenium is about 2.9
aluminum is about 5.5
titanium is about 0.8
tantalum is about 7.7, and
halfnium is about 0.1 percent.

* * * * *

UNITED STATES PATENT AND TRADEMARK OFFICE
CERTIFICATE OF CORRECTION

PATENT NO. : 4,935,072
DATED : June 19, 1990
INVENTOR(S) : Xuan Nguyen-Dinh

It is certified that error appears in the above-identified patent and that said Letters Patent is hereby corrected as shown below:

In the cover sheet, under References Cited, U.S. PATENT DOCUMENTS, add:

4,719,080 1/1988 Duhl et al. ............... 420/443

In the specification:

Column 1, line 16, replace "." with -- , --; line 59, insert -- for -- after "need".

Figure 1:
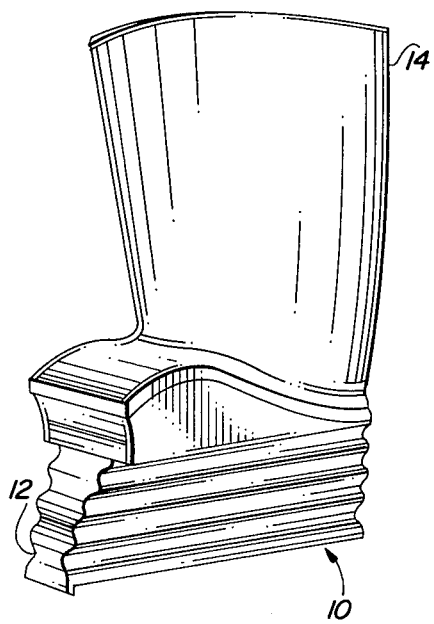
FIG. 1 is a perspective view of a turbine blade.

Column 3, line 40, replace "FIG. i" with -- FIG. 1 --.

Column 4, lines 29 and 30, replace "&he" with -- the --; line 55, replace "crystal" with -- crystals --.

Column 5, line 2, delete "&".

Column 10, line 26, replace "0.008" with -- 0.08 --.

Column 12, line 46, replace "&est" with -- test --.

Column 13, line 59, replace "29.6" with -- 29.5 --; line 65, replace "131.1" with -- 132.1 --.

Column 14, line 11, replace "87.6" with -- 87.5 --; line 36, replace "24.5" with -- 24.6 --.

Column 15, line 22, replace "FIG. 4 Third if" with -- FIG. 4. Third, if --.

UNITED STATES PATENT AND TRADEMARK OFFICE
CERTIFICATE OF CORRECTION

PATENT NO. : 4,935,072

DATED : June 19, 1990

INVENTOR(S) : Xuan Nguyen-Dinh

It is certified that error appears in the above-identified patent and that said Letters Patent is hereby corrected as shown below:

Column 16, line 6, replace "+Co TM 14.8." with
-- +Co = 14.8. --; line 25, replace "Of" with -- of --;
line 54, after "base" delete "."; line 55, delete the first
occurrence of "a".

Column 17, line 7, replace "i" with -- 1 --.

Column 19, line 17, change "0.01" to -- 0.1 --.

Correct the spelling of -- molybdenum -- at Column 18,
lines 52, 61 and 68; Column 19, line 11; and Column 20,
lines 2 and 12.

Correct the spelling of -- tantalum -- at Column 18, line 58;
Column 19, lines 6 and 16; and Column 20, line 7.

Correct the spelling of -- hafnium -- at Column 18, line 59;
Column 19, lines 7 and 17; and Column 20, lines 8 and 18.

Signed and Sealed this

Twenty-second Day of October, 1991

*Attest:*

HARRY F. MANBECK, JR.

*Attesting Officer*  *Commissioner of Patents and Trademarks*